(12) United States Patent
Lin

(10) Patent No.: US 7,881,691 B2
(45) Date of Patent: Feb. 1, 2011

(54) DIRECT CONVERSION TV TUNER AND METHOD THEREOF

(75) Inventor: Chia-Liang Lin, Union City, CA (US)

(73) Assignee: Realtek Semiconductor Corp., Science Park, HsinChu (TW)

( * ) Notice: Subject to any disclaimer, the term of this patent is extended or adjusted under 35 U.S.C. 154(b) by 1159 days.

(21) Appl. No.: 11/465,458

(22) Filed: Aug. 18, 2006

(65) Prior Publication Data

US 2007/0270117 A1 Nov. 22, 2007

Related U.S. Application Data

(63) Continuation-in-part of application No. 11/419,507, filed on May 21, 2006, now Pat. No. 7,620,381.

(51) Int. Cl.
*H04B 1/16* (2006.01)
(52) U.S. Cl. ...................................... 455/324
(58) Field of Classification Search ................. 455/323, 455/324, 325, 326, 333, 334
See application file for complete search history.

(56) References Cited

U.S. PATENT DOCUMENTS

| 4,468,784 | A | 8/1984 | Jagnow |
| 4,628,270 | A | 12/1986 | Roberts |
| 5,697,091 | A | 12/1997 | Hirschenberger |
| 6,041,223 | A | 3/2000 | Thomas |
| 6,642,874 | B1 | 11/2003 | Lin |
| 6,845,233 | B2 | 1/2005 | Louis |
| 6,933,766 | B2 | 8/2005 | Khlat |
| 6,999,747 | B2* | 2/2006 | Su ............................ 455/324 |
| 7,130,604 | B1 | 10/2006 | Wong |
| 7,190,943 | B2 | 3/2007 | Davis |
| 7,457,606 | B2 | 11/2008 | Kim |
| 7,471,134 | B2 | 12/2008 | Dornbusch |
| 2004/0120422 | A1 | 6/2004 | Lin |
| 2005/0233723 | A1 | 10/2005 | Gomez |
| 2005/0239430 | A1 | 10/2005 | Shah |
| 2005/0271173 | A1 | 12/2005 | Chou |
| 2006/0160518 | A1 | 7/2006 | Seendripu |

\* cited by examiner

*Primary Examiner*—Blane J Jackson
(74) *Attorney, Agent, or Firm*—Winston Hsu; Scott Margo

(57) ABSTRACT

A direct conversion method is disclosed. The method comprises: amplifying the input signal to generate an amplified signal; down-converting the amplified signal into two intermediate signals using a first set of ternary signals and a second set of ternary signals, respectively; filtering the first intermediate signal to generate a third intermediate signal; filtering the second intermediate signal to generate a fourth intermediate signal; digitizing the third intermediate signal into a first output signal in accordance with a first clock; digitizing the fourth intermediate signal into a second output signal in accordance with the first clock; and generating the first set of ternary signals and the second set of ternary signals based on a second clock.

24 Claims, 11 Drawing Sheets waveform of $G_1*MLT3^{(3/8)}(t+\tau)+G_2*MLT3^{(3/8)}(t)+G_3*MLT3^{(3/8)}(t-\tau)$ (B)

DIRECT CONVERSION TV TUNER AND METHOD THEREOF

RELATED APPLICATION

This application is a continuation-in-part of a co-pending application Ser. No. 11/419,507, filed on May 21, 2006, having the title "Tri-state chopper for frequency conversion."

BACKGROUND OF THE INVENTION

1. Field of the Invention

The present invention relates to a TV tuner, in particular to direct conversion TV tuner.

2. Description of Related Art

Direct conversion receiver is well known in prior art. FIG. 1 depicts a functional block diagram of a typical direct conversion receiver 100, which comprises: a pre-filter 110; a LNA (low-noise amplifier) 120; an in-phase (I) path comprising a first mixer 130_I, a first LPF (low pass filter) 140_I, and a first ADC (analog-digital converter) 150_I; and a quadrature (Q) path comprising a second mixer 130_Q, a second LPF (low pass filter) 140_Q, and a second ADC (analog-digital converter) 150_Q. Pre-filter 110 performs a preliminary filtering on a RF (radio frequency) input RF_IN and passes an output to LNA 120, which performs a low-noise amplification on the output of pre-filter 110 and generates a RF signal 122 provided as an input to both the in-phase (I) path and the quadrature (Q) path. The in-phase path receives the RF signal 122 and converts it into a first digital baseband signal BB_I by mixing the RF signal 122 with an in-phase clock LO_I using mixer 130_I, filtering an output of mixer 130_I using LPF 140_I, and converting the output of LPF 140_I into the digital baseband signal BB_I using ADC 150_I. The quadrature path receives the RF signal 122 and converts it into a second digital baseband signal BB_Q by mixing the RF signal 122 with a quadrature clock LO_Q using mixer 130_Q, filtering an output of mixer 130_Q using LPF 140_Q, and converting the output of LPF 140_Q into the digital baseband signal BB_Q using ADC 150_Q. In general, the input signal RF_IN is a wide-band signal that contains many spectral components, among which only a narrow-band component is to be selected. To satisfy the condition of "direct conversion," both the in-phase clock LO_I and the quadrature clock LO_Q must have the same frequency as the desired narrow-band component, and also the phase difference between the in-phase clock LO_I and the quadrature clock LO_Q must be 90 degrees.

Although the principle of direct conversion receiver has been well known in prior art, it is very difficult to apply direct conversion to a TV tuner due to a problem known as "harmonic mixing" caused by an undesired but inevitable mixing within the two mixers (130_I and 130_Q). In particular, a practical mixer is subject to generating spurious mixing products among its input RF signal and odd-order harmonics of the LO clock. For instance, a tuner needs to be tuned to select a channel among a plurality of channels ranging from 47 MHz to 862 MHz. If the tuner were tuned to 100 MHz using direct conversion architecture, both LO clocks (LO_I and LO_Q) must also be 100 MHz in frequency. While the desired channel (at 100 MHz) can be successfully converted into the two baseband signals, the signal of an undesired channel at 300 MHz will also be converted and become a part of the two baseband signals, since the undesired signal at 300 MHz will also be mixed with the $3^{rd}$ harmonics of the LO signals. A mixer can be implemented either as a "multiplying mixer" or a "switching mixer"; neither is immune from the "harmonic mixing" problem.

What is needed is a method to perform frequency conversion without having spurious mixing problems caused by harmonic mixing.

BRIEF SUMMARY OF THIS INVENTION

In an embodiment, a receiver is disclosed, the receiver comprising: a gain device for receiving an input signal and for generating an amplified signal; a quadrature frequency converter for receiving the amplified signal, a first set of ternary signals, and a second set of ternary signals and for generating a first intermediate signal and a second intermediate signal; a first filter for receiving the first intermediate signal and for generating a third intermediate signal, a second filter for receiving the second intermediate signal and for generating a fourth intermediate signal; a first ADC for receiving the third signal and a first clock signal and for generating a first output signal; a second ADC for receiving the fourth signal and the first clock and for generating a second output signal; a clock generator for generating the first clock; and a control signal generator for generating the first set of ternary signals and the second set of ternary signals.

In an embodiment, a method of processing an input signal is disclosed, the method comprising: amplifying the input signal to generate an amplified signal; down-converting the amplified signal into two intermediate signals using a first set of ternary signals and a second set of ternary signals, respectively; filtering the first intermediate signal to generate a third intermediate signal; filtering the second intermediate signal to generate a fourth intermediate signal; digitizing the third intermediate signal into a first output signal in accordance with a first clock; digitizing the fourth intermediate signal into a second output signal in accordance with the first clock; and generating the first set of ternary signals and the second set of ternary signals based on a second clock.

DETAILED DESCRIPTION OF THIS INVENTION

The present invention relates to a tri-state chopper circuit and its application to a direct conversion receiver. While the specifications described several example embodiments of the invention considered best modes of practicing the invention, it should be understood that the invention can be implemented in many way and is not limited to the particular examples described below or to the particular manner in which any features of such examples are implemented. In other instances, well-known details are not shown or described to avoid obscuring aspects of the invention.

Tri-State Chopper

Figure 1:
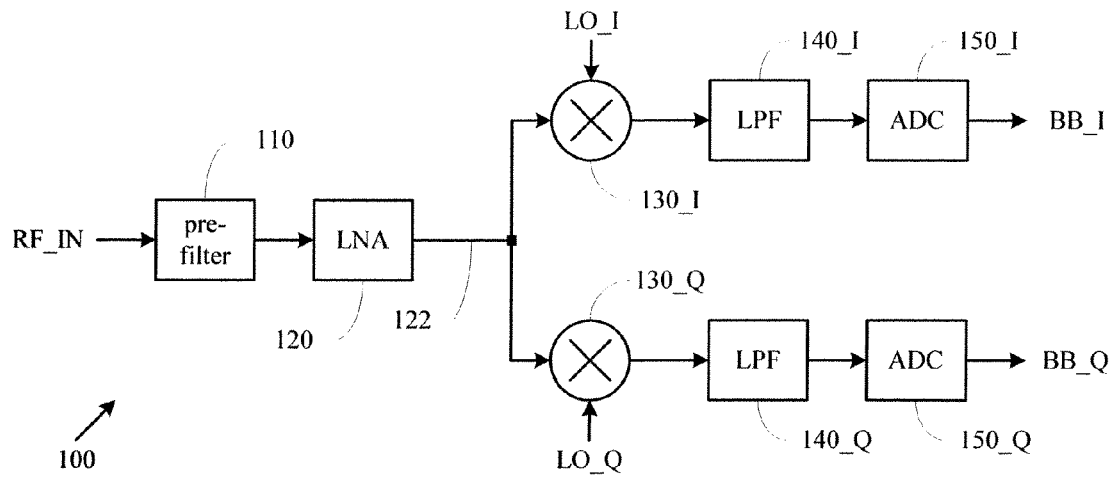
FIG. 1 shows a block diagram of a prior art direct conversion receiver.
Figure 2:
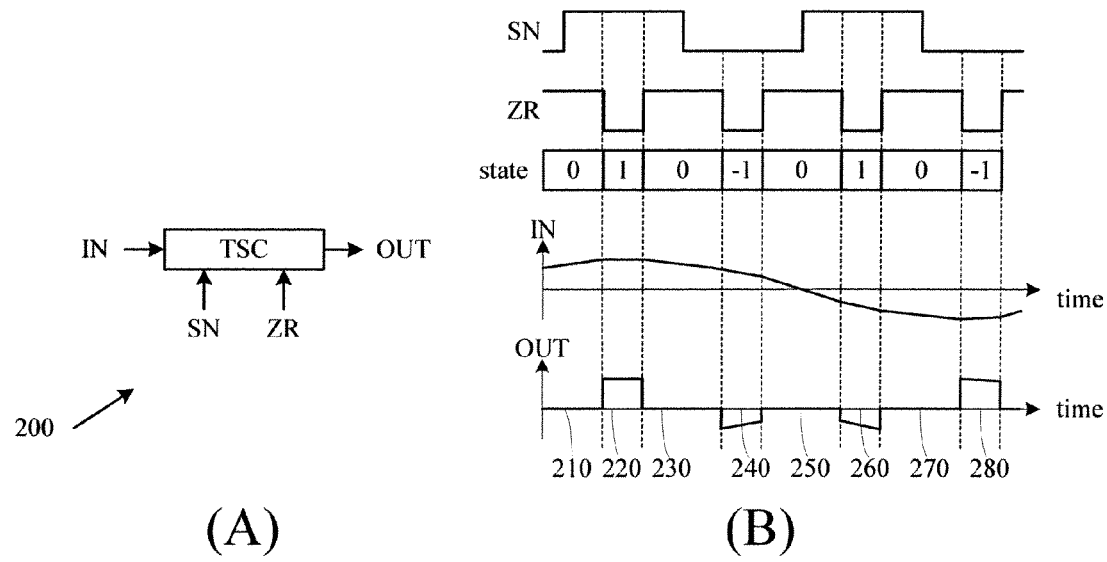
FIG. 2 shows a symbol (A) and an exemplary timing diagram (B) for a tri-state chopper (TSC) circuit.

A tri-state chopper (TSC) receives an input signal and a ternary control signal and generates an output signal. A ternary control signal has three states, say "1," "−1," and "0." In a first state ("1"), the output signal tracks the input signal in both magnitude and sign; in a second state ("−1"), the output signal tracks the input signal in magnitude but has an opposite sign; and in a third state ("0"), the output signal is zero, regardless of the input signal. A ternary control signal can be represented by two or more binary control signals. In a preferred embodiment, two logical (binary) signals SN (which stands for "sign") and ZR (which stands for "zero") are used to represent a ternary signal. As shown in FIG. 2(A), a tri-state chopper (TSC) circuit 200 receives an input signal IN and a ternary control signal represented by two control signals, SN and ZR, and generates an output signal OUT. Both SN and ZR are logical signals, and each has two logical states: high and low. The ternary signal is in the first state ("1") when SN is high but ZR is low; in this case the output OUT follows the input IN in both magnitude and sign, i.e. OUT is proportional to IN. The ternary signal is in the second state ("−1") when both SN and ZR are low; in this case the output OUT follows the input IN in magnitude and has an opposite sign, i.e. OUT is proportional to an inversion of IN. The ternary signal is in the third state ("0") when ZR is high; in this case the output OUT is zero, regardless of the input signal. An exemplary timing diagram of a TSC circuit is shown in FIG. 2(B). During time spans 210, 230, 250, and 270, ZR is high and thus the ternary control signal is in the third state ("0"); therefore the output OUT is zero. During time spans 220 and 260, ZR is low but SN is high and thus the ternary control signal is in the first state ("1"); therefore, the output OUT follows the input IN in both magnitude and sign. During time spans 240 and 280, both ZR and SN are low and thus the ternary control signal is in the second state ("−1"); therefore, the output OUT follows the input IN in magnitude but has an opposite sign.

Throughout this invention, the two control signals SN ("sign") and ZR ("zero") along with their encoding scheme described above are used to represent a ternary control signal for controlling a TSC circuit. However, it must be understood that, for those of ordinary skill in the art, a ternary control signal can be represented by many alternative encoding schemes. In particular, two binary signals can represent up to four distinct states, but a ternary control signals only has three states. Therefore, one can freely choose any scheme that maps the four distinct states represented by the two binary signals into the three distinct states represented by the ternary control signal. In an alternative embodiment, one may choose to use three binary signals $C_1$, $C_{-1}$, and $C_0$ to represent a ternary control signal. At any time instant, one of the three binary signals must be high and the other two must be low. The ternary control signal is in the first state when $C_1$ is high and both $C_{-1}$ and $C_0$ are low; the ternary control signal is in the second state when $C_{-1}$ is high and both $C_1$ and $C_0$ are low; and the ternary control signal is in the third state when $C_0$ is high and $C_1$, and $C_{-1}$ are low.

Figure 3:
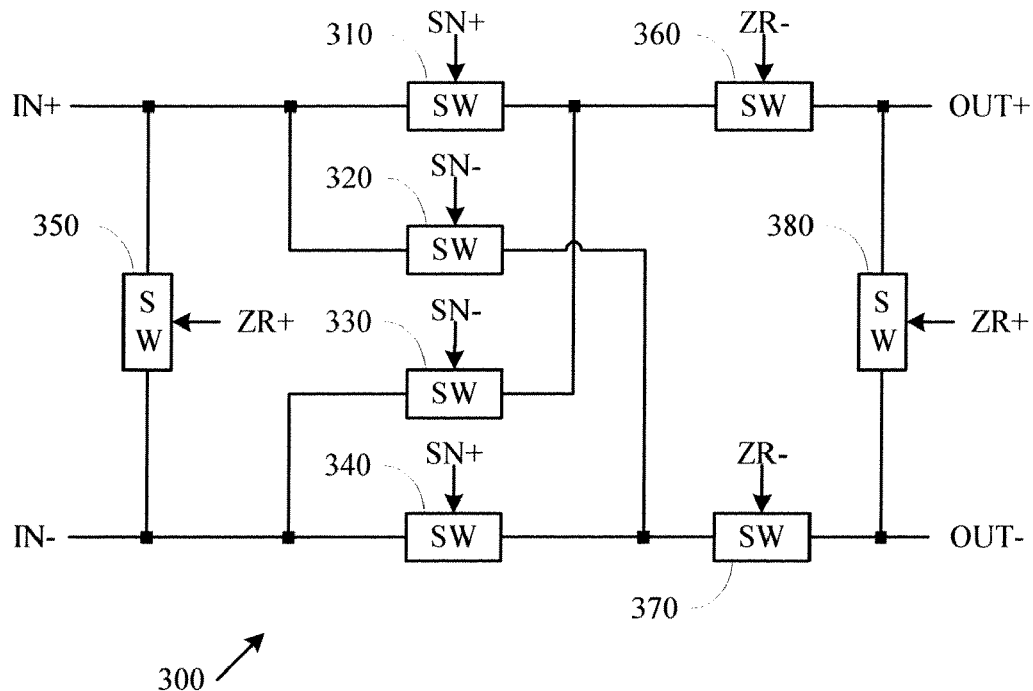
FIG. 3 shows an exemplary embodiment of a TSC circuit.

FIG. 3 shows an exemplary embodiment for a TSC circuit 300 comprising a plurality of switches SW 310-380. Here, a differential circuit embodiment is used, where the input is embodied by a differential signal IN+/−, the output is embodied by a differential signal OUT+/−, the first control signal SN is embodied by SN+ and its logical inversion SN−, and the second control signal ZR is embodied by ZR+ and its logical inversion ZR−. Each switch (310-380) has two states: "closed" and "open," controlled by a logical signal; the switch is closed when the controlling logical signal is high, and is open otherwise. In a first state where ZR is low (i.e., ZR+ is logically low and ZR− is logically high) and SN is high (i.e., SN+ is logically high and SN− is logically low), IN+ is coupled to OUT+ through SW 310 and 360, while IN− is coupled to OUT− through SW 340 and 370. In this first state, the output follows the input without a polarity flip. In a second state where ZR is low (i.e., ZR+ is logically low and ZR− is logically high) and SN is also low (i.e., SN+ is logically low and SN− is logically high), IN+ is coupled to OUT− through SW 320 and 370, while IN− is coupled to OUT+ through SW 330 and 360. In this second state, the output follows the input but has a polarity reversion. In a third state where ZR is high (i.e., ZR+ is logically high and ZR− is logically low), the differential input IN+/− and the differential output OUT+/− are decoupled from each other, IN+ is coupled to IN− through SW 350, and OUT+ is coupled to OUT− through SW 380. In this third state, the differential output is effectively zero. Implementation of a switch circuit, e.g. using a MOSFET (metal-oxide semiconductor field effect transistor), is well known to those of ordinary of skill in the art and thus not described here.

Tri-State Chopper Based Frequency Conversion

Figure 4:
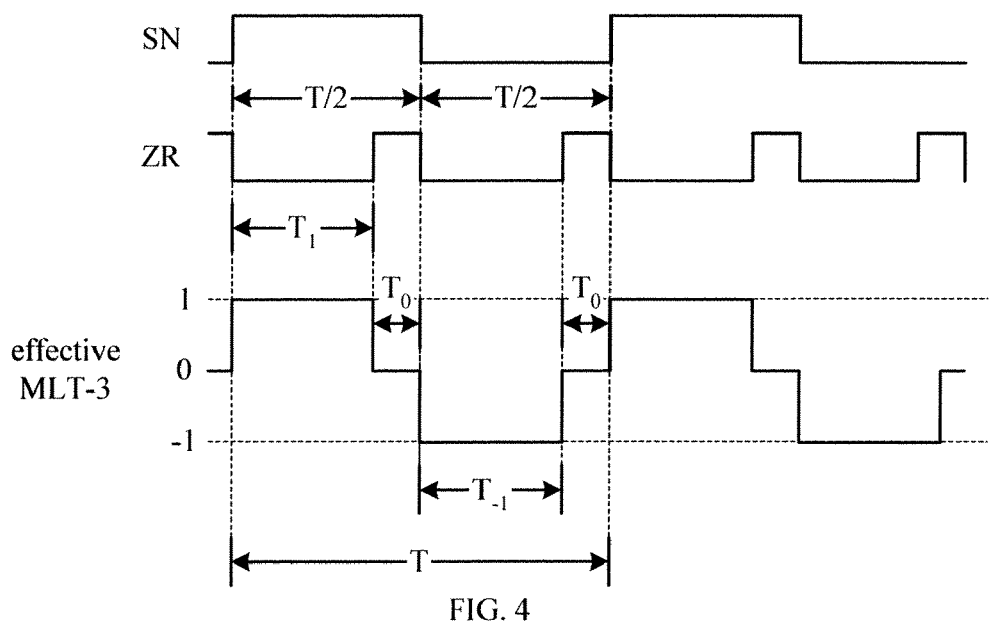
FIG. 4 shows an exemplary MLT3 (multi-level transmit, 3-level) waveform implied in a TSC circuit.

A TSC circuit can be used to perform a frequency conversion if its ternary control signal is periodic, i.e. both control signals SN and ZR are periodic in the preferred encoding scheme. However, a TSC circuit, when used as an apparatus for performing frequency conversion, can be tailored to have a better harmonic suppression than a prior art mixer. A prior art mixer, which receives an input signal and a LO (local oscillator) signal and generates an output signal, is analogous to a two-state chopper circuit, where the output follows the input but will be conditionally flipped (in terms of signal polarity) unless the LO signal is high. In a prior art mixer, the output signal is equivalent to the input signal multiplied with a square wave, whose frequency is the same as the LO signal's frequency. Mathematically the following Fourier series can represent a square wave of period T of 50% duty-cycle:

$$SQ(t) = \frac{4}{\pi}\left(\sin(\omega t) + \frac{1}{3} \cdot \sin(3\omega t) + \frac{1}{5} \cdot \sin(5\omega t) + \frac{1}{7} \cdot \sin(7\omega t) + \frac{1}{9} \cdot \sin(9\omega t) + \frac{1}{11} \cdot \sin(11\omega t) + \cdots \right)$$

where $\omega = 2\pi/T$. A square wave, therefore, has very strong $3^{rd}$ order and $5^{th}$ order harmonics. On the other hand, a TSC circuit has an extra degree of freedom for a user to manipulate the relative strengths of harmonics mixings thanks to using two control signals SN and ZR (as opposed to using only one control signal LO in a prior art mixer.). In particular, when SN is a square wave of period T and ZR is a rectangular wave of period T/2, the output signal OUT is equivalent to the input signal IN multiplied with a MLT3 (multi-level transmit, 3-level) wave of period T. FIG. 4 shows an exemplary MLT3 wave corresponding to a case where SN is a square wave of period T and ZR is a rectangular wave of period T/2. Here, the MLT3 wave has three levels: "1" (when SN=1 and ZR=0), "−1" (when SN=0 and ZR=0), and "0" (when ZR=1). Also, the MLT3 wave exhibits a periodic pattern: 0, 1, 0, −1, 0, 1, 0, −1, and so on. The period is T; the durations each time it stays at the three levels "1," "0," and "−1" are $T_1$, $T_0$, and $T_{-1}$, respectively. To have a good even-order harmonic suppression, one needs to have $T_1 = T_{-1}$. The relative strength of any particular odd order harmonics of interest to the fundamental frequency (i.e., 1/T) can be suppressed by choosing a proper ratio between $T_1$ and T. In a special case of particular interest where $T_1/T=1/3$ (and also $T_{-1}/T=1/3$ and $T_0/T=1/6$), the MLT3 wave can be represented by the following Fourier series:

$$MLT3^{(1/3)}(t) = \frac{4\cos(\pi/6)}{\pi}\left(\sin(\omega t) - \frac{1}{5}\cdot\sin(5\omega t) - \frac{1}{7}\cdot\sin(7\omega t) + \frac{1}{11}\cdot\sin(11\omega t) + \frac{1}{13}\cdot\sin(13\omega t) + \cdots\right)$$

Here, the $3^{rd}$ order, the $9^{th}$ order, and in general any 3K-th order (where K is an integer) harmonics are all zero. Therefore, a TSC circuit offers a flexibility of a selective harmonics rejection that is not possible in a prior art mixer. Note that the subscript (1/3) denotes $T_1/T=T_{-1}/T=1/3$.

Choosing $T_1/T=1/3$ (and also $T_{-1}/T=1/3$ and $T_0/T=1/6$) results in a perfect rejection of any 3K-th order harmonics, and therefore is a very favorable choice.

Another choice of interest is $T_1/T=3/8$ (and also $T_{-1}/T=3/8$ and $T_0/T=1/8$). The corresponding MLT3 wave can be represented by the following Fourier series:

$$MLT3^{(3/8)}(t) = \frac{4\cos(\pi/8)}{\pi}\cdot\sin(\omega t) + \frac{4\cos(3\pi/8)}{3\pi}\cdot\sin(3\omega t) - \frac{4\cos(3\pi/8)}{5\pi}\cdot\sin(5\omega t) + \cdots$$

The subscript (3/8) denotes $T_1/T=T_{-1}/T=3/8$. The harmonic components are lower than those of a square wave.

In many applications, it is desirable to completely reject the $5^{th}$ order, the $7^{th}$ order, and/or some other odd order harmonics as well. Using a plurality of parallel TSC circuits, each performing a certain MLT3 multiplication, one can fulfill this objective.

Tri-State Chopper Based Harmonics Rejection Frequency Conversion

Figure 5A:
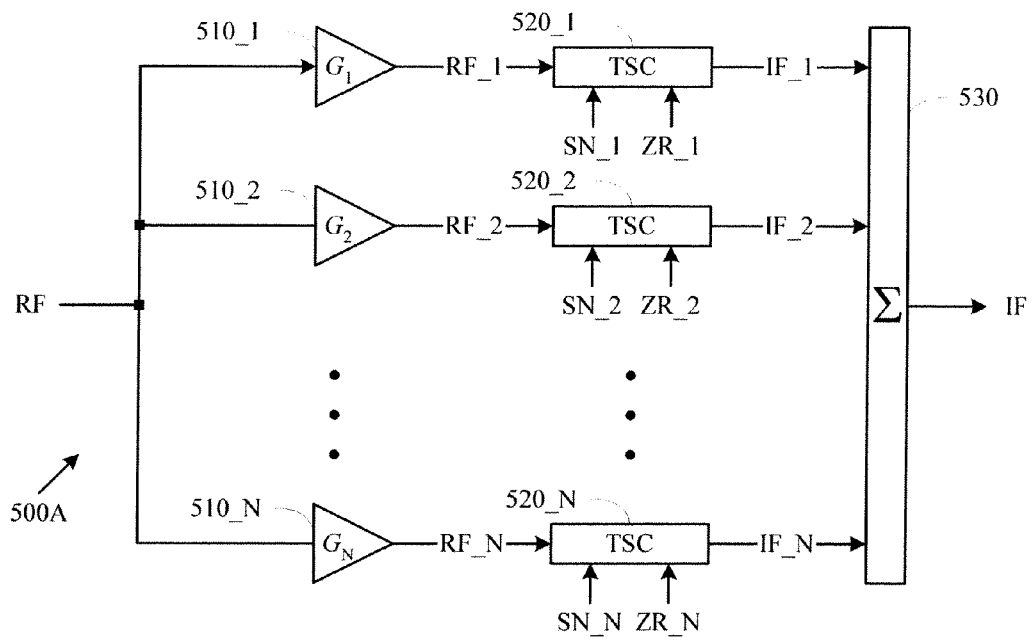
FIG. 5A shows an embodiment of a frequency converter using a plurality of TSC circuits.

In an embodiment shown in FIG. 5A, a harmonics rejection frequency converter 500A comprises a plurality of TSC-based frequency conversion paths, constructed in parallel to convert an input signal denoted by RF (radio frequency) into a plurality of conversion signals, and a summing circuit to sum up said conversion signals to yield an output signal denoted by IF (intermediate frequency). Each conversion path comprises a gain element, which scales the input signal RF by a gain factor, and a TSC circuit, which receives the scaled RF signal and converters the scaled RF signal into an intermediate output by performing a MLT3 multiplication using two control signals. For instance, in a first conversion path, gain element 510_1 scales the input signal RF by a factor of $G_1$, resulting in a scaled RF signal RF_1, which is converted by TSC circuit 520_1 by effectively performing a MLT3 multiplication based on two control signals SN_1 and ZR_1, resulting in an output IF_1 accordingly. The outputs from all TSC circuits are then summed using a summing circuit 530, resulting in the final output signal IF. Harmonics rejection can be achieved by properly choosing the gain factors ($G_1$, $G_2$, and so on) and the timings of all the control signals (SN_1, ZR_1, SN_2, ZR_2, and so on). In an alternative embodiment shown in FIG. 5B, the location of the gain element is swapped with the location of the TSC circuit for each conversion path. For instance, gain element 510_1 is swapped with TSC 520_1 in the first conversion path. It is obvious to those of ordinary skill in the art that the function of frequency converter 500B of FIG. 5B is equivalent to the function of the frequency converter 500A of FIG. 5A.

Figure 5B:
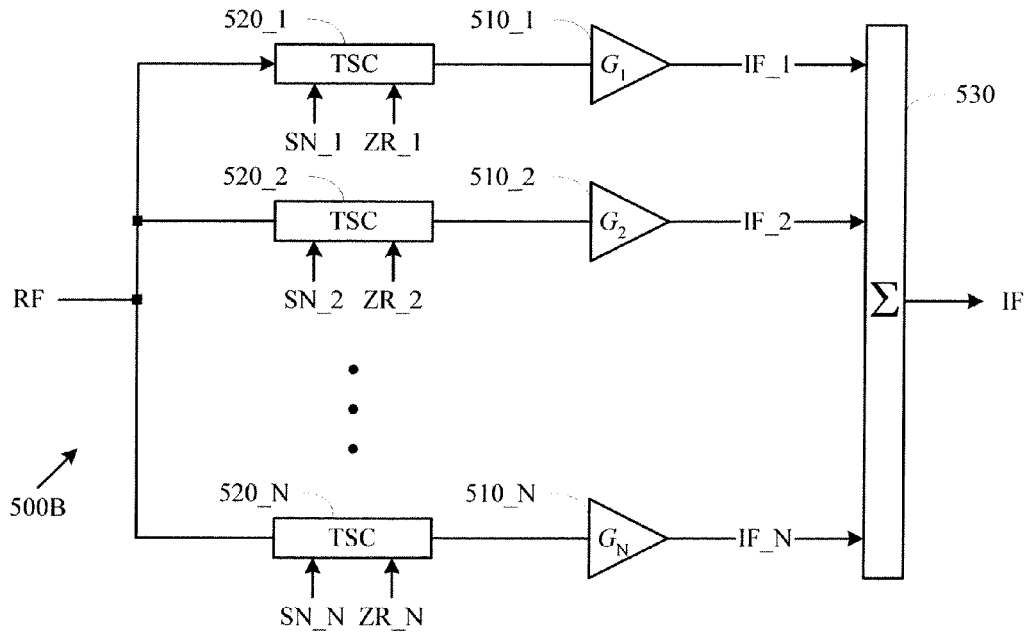
FIG. 5B shows an alternative embodiment of a frequency converter using a plurality of TSC circuits.

In a special case of particular interest, one uses three TSC circuits (i.e. N=3 for FIG. 5A or FIG. 5B). In a special case, all three TSC circuits effectively implement a multiplication with a $MLT3^{(1/3)}$ wave, i.e. a MLT3 wave having a $T_1/T$ value of 1/3 (and also a $T_{-1}/T=1/3$ and a $T_0/T=1/6$). Their respective MLT3 waves have exactly the same frequency (1/T) but different phases. The timing of the first MLT3 wave (corresponding to the first TSC circuit 520_1) is earlier than the timing of the second MLT3 wave (corresponding to the second TSC circuit 520_2) by an amount of τ. Also, the timing of the second MLT3 wave is earlier than the timing of the third MLT3 wave (corresponding to the third TSC circuit 520_N when N=3) by an amount of τ. Under these conditions, the output IF is equivalent to the multiplication of the input RF with a synthesized composite wave $M^{(1/3)}(t)$, which can be expressed mathematically as:

$$M^{(1/3)}(t)=G_1\cdot MLT3^{(1/3)}(t+\tau)+G_2\cdot MLT3^{(1/3)}(t)+G_3\cdot MLT3^{(1/3)}(t-\tau)$$

By choosing τ=T/12, i.e. τ=π/(6ω), $G_2=2\cos(\pi/6)\cdot G_1$, and $G_3=G_1$, it can be shown that $$M^{(1/3)}(t) = G_1\cdot MLT3^{(1/3)}(t+\tau) + G_2\cdot MLT3^{(1/3)}(t) + G_3\cdot MLT3^{(1/3)}(t-\tau)$$
$$= \frac{16\cos^2(\pi/6)G_1}{\pi}\sin(\omega t) +$$
$$(11th \text{ and higher order harmonics})$$

Therefore, $5^{th}$ order and $7^{th}$ order harmonics are both eliminated, and the composite wave is spurious free until the $11^{th}$ harmonics since the $MLT3^{(1/3)}$ wave itself is already free of $9^{th}$ order harmonics.

Figure 6:
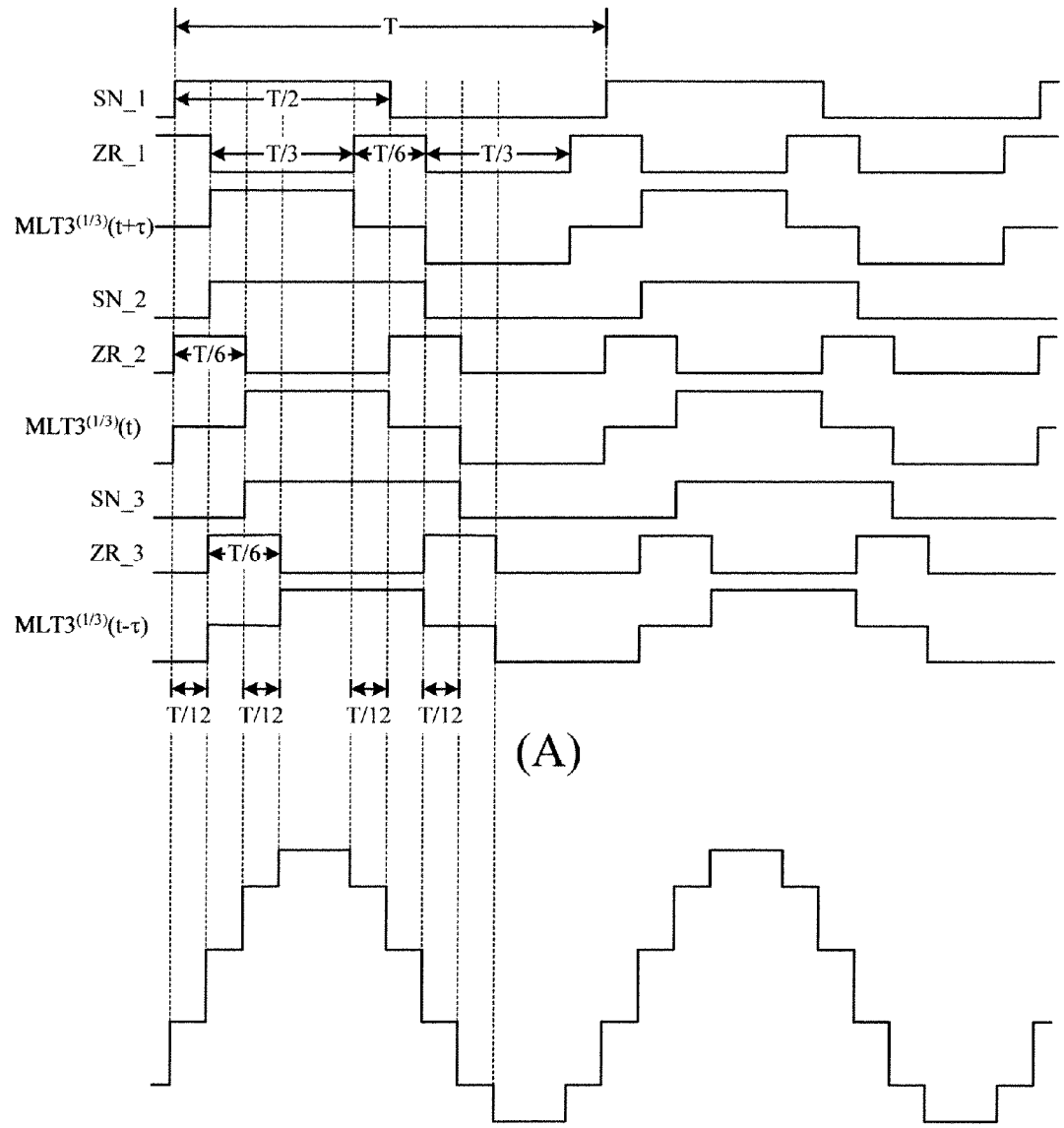
FIG. 6 shows a typical timing diagram of control signals and associated MLT3 waves for the frequency converter of either FIG. 5A or FIG. 5B (A), and a composite waveform after a weighted sum (B).

An exemplary timing diagram for these three TSC circuits and their corresponding $MLT3^{(1/3)}$ waves is shown in FIG. 6(A). All three "sign" controls (SN_1, SN_2, and SN_3) are square waves of period T with 50% duty cycle; however, their timings are spaced in a T/12 step, i.e. SN_2 has a delay of T/12 relative to SN_1, and SN_3 has a delay of T/12 relative to SN_2. All three "zero" controls (ZR_1, ZR_2, and ZR_3) are rectangular waves of period T/2 with 1/3 duty cycle (i.e. stay high for a duration of T/6 and then stay low for a duration of T/3 in each cycle); however, their timings are spaced in a T/12 step, i.e. ZR_2 has a delay of T/12 relative to ZR_1, and ZR_3 has a delay of T/12 relative to ZR_2. The respective $MLT3^{(1/3)}$ waveforms for these three TSC circuits are also depicted and shown in FIG. 6(A). By scaling each $MLT3^{(1/3)}$ signal with a respective gain and summing the scaled MLT3$^{(1/3)}$ signals together, one can synthesize a waveform to approximate a sinusoidal wave, as shown in FIG. 6(B). Since the synthesized waveform is close to an ideal sinusoidal signal, the harmonics are greatly suppressed, compared to a square wave or a single MLT3$^{(1/3)}$ wave. Note that the scaling is realized using a gain element associated with each TSC circuit; and the summing is realized using a summing circuit.

Figure 7:
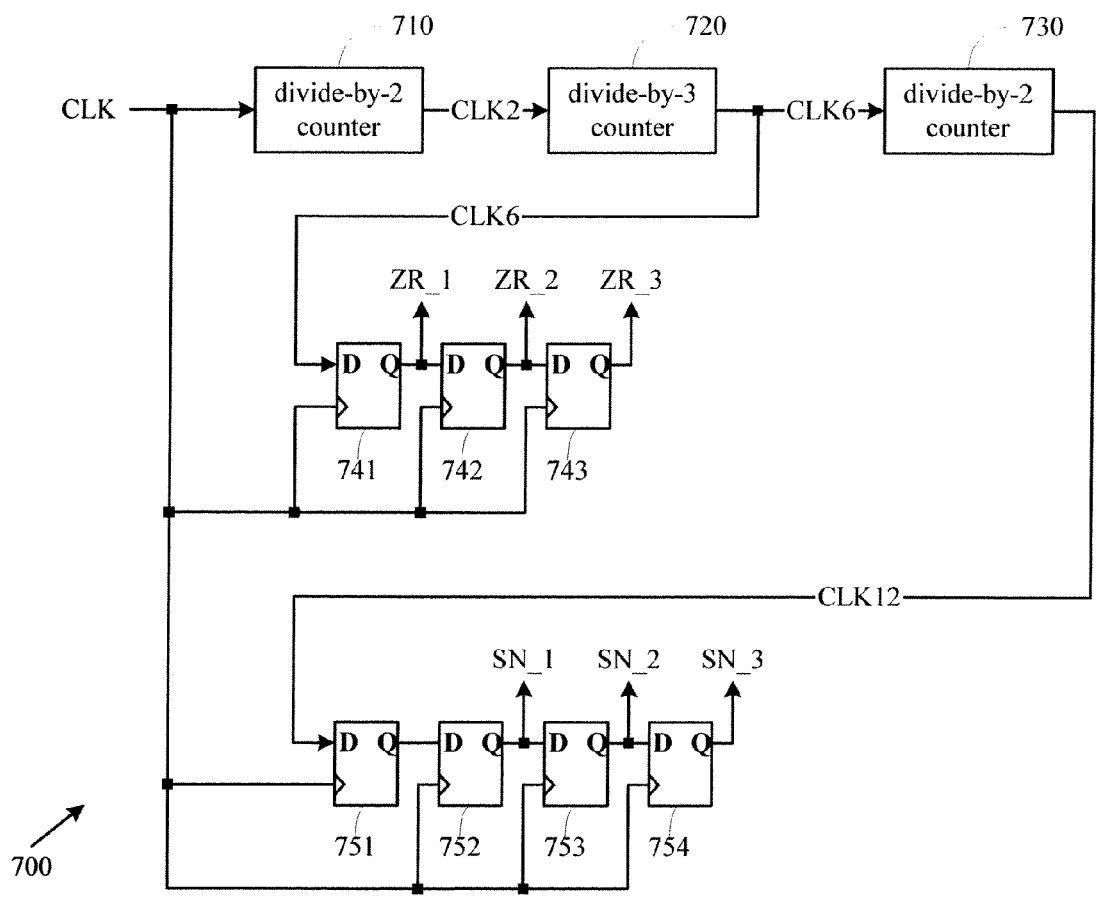
FIG. 7 shows an embodiment for generating the control signals shown in FIG. 6.

FIG. 7 shows an exemplary embodiment for generating the control signals needed for implementing the three MLT3 waves shown in FIG. 6(A). A first clock CLK of period T/12 must be provided, say from a phase-lock-loop (PLL) circuit. A second clock CLK2 of period T/6 is derived from the first clock CLK using a first divide-by-2 counter 710. A third clock CLK6 of period T/2 is derived from the second clock CLK2 using a divide-by-3 counter 720. Note that the duty cycle of CLK6 is ⅓, because CLK6 is generated from a divide-by-3 counter; the reason is well understood in prior art and thus not explained here. A fourth clock CLK12 of period T is generated from the third clock CLK6 using a second divide-by-2 counter 730. Note that the duty cycle of CLK 12 is ½, because CLK12 is generated from a divide-by-2 counter 730; the reason is well understood in prior art and thus not explained here. A first register array comprising DFF (data flip flop) 741, 742, and 743 is used to sample the third clock CLK6 at a rising edge of the first clock CLK, resulting in three "zero" signals, ZR_1, ZR_2, and ZR_3. As a result, the three "zero" signals have the same period of T/2 and the same duty cycle of ⅓ but have timings spaced in a step of T/12. A second register array comprising DFF (data flip flop) 751, 752, 753, and 754 is used to sample the fourth clock CLK12 at a rising edge of the first clock CLK, resulting in three "sign" signals, SN_1, SN_2, and SN_3. As a result, the three "sign" signals have the same period of T and the same duty cycle of ½ but have timings spaced in a step of T/12. Note that there is one more DFF (751) inserted in the second register array, therefore, the three "sign" signals have an extra delay of T/12 compared to the three "zero" signals. The detailed circuit embodiments of a data flip-flop, a divide-by-2 counter, and a divide-by-3 counter are well know to those of ordinary skill in the art and thus are not described here.

In another special case all three TSC circuits (of FIG. 5A or FIG. 5B) effectively implement a multiplication with a MLT3$^{(3/8)}$ wave, i.e. a MLT3 wave having $T_1/T=T_{-1}/T=3/8$ (and also $T_0/T=1/8$). Their respective MLT3 waves have exactly the same frequency (1/T) but different phases. The timing of the first MLT3 wave (corresponding to the first TSC circuit 520_1) is earlier than the timing of the second MLT3 wave (corresponding to the second TSC circuit 520_2) by an amount of τ. Also, the timing of the second MLT3 wave is earlier than the timing of the third MLT3 wave (corresponding to the third TSC circuit 520_N when N=3) by an amount of τ. Under these conditions, the output IF is equivalent to the multiplication of the input RF with a synthesized composite wave M$^{(3/8)}$(t), which can be expressed mathematically as:

$$M^{(3/8)}(t)=G_1 \cdot MLT3^{(3/8)}(t+\tau)+G_2 \cdot MLT3^{(3/8)}(t)+G_3 \cdot MLT3^{(3/8)}(t-\tau)$$

By choosing τ=T/8, i.e. τ=π/(4ω), $G_2=2\cos(\pi/4) \cdot G_1$, and $G_3=G_1$, it can be shown that $$M^{(3/8)}(t) = G_1 \cdot MLT3^{(3/8)}(t+\tau) + G_2 \cdot MLT3^{(3/8)}(t) + G_3 \cdot MLT3^{(3/8)}(t-\tau)$$

$$= \frac{16\cos(\pi/8)\cos(\pi/4)G_1}{\pi}\sin(\omega t) +$$

(7th and higher order harmonics)

Therefore, 3$^{rd}$ order and 5$^{th}$ order harmonics are both eliminated, and the composite wave is spurious free until the 7$^{th}$ harmonics.

Figure 8:
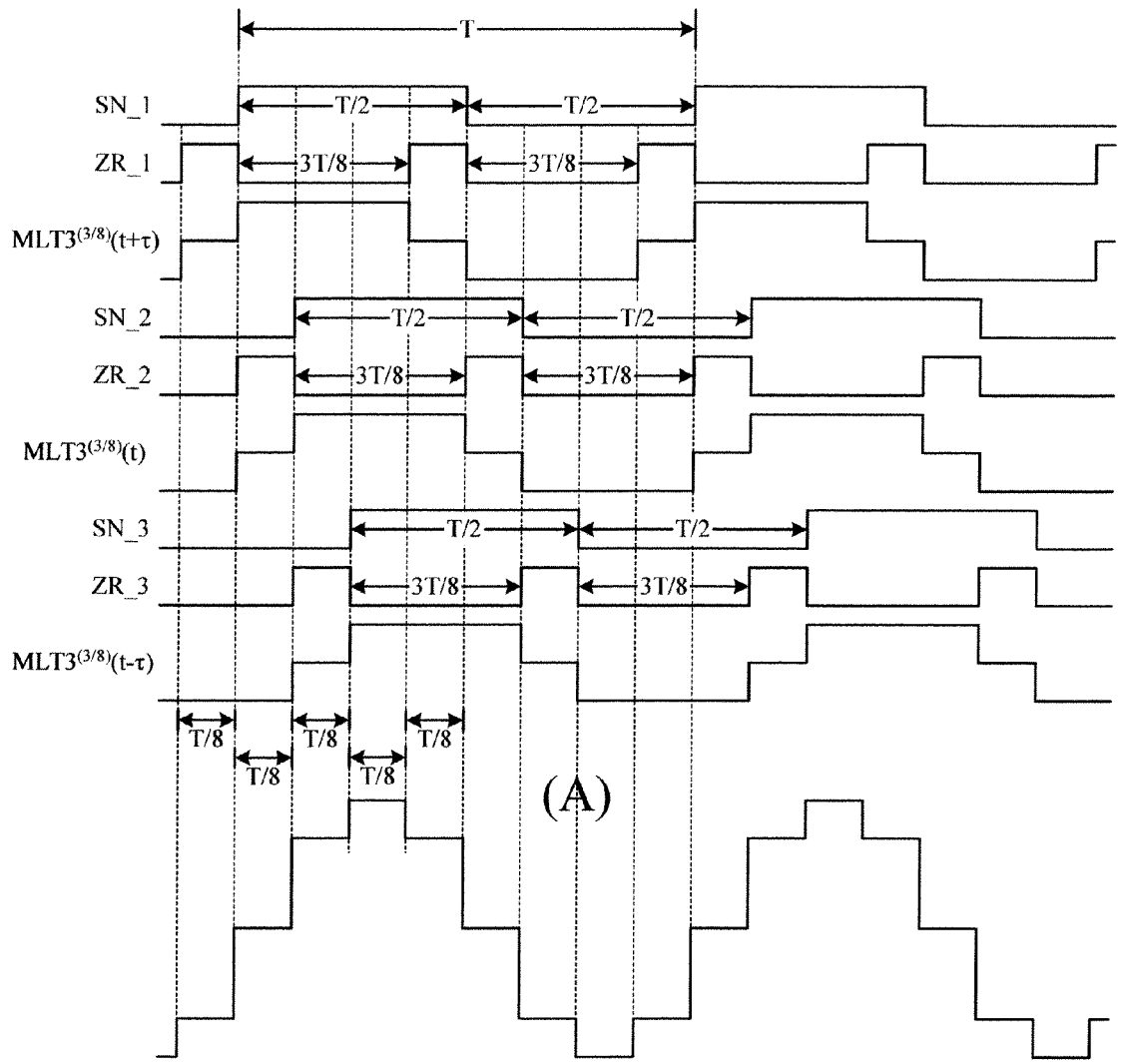
FIG. 8 shows another typical timing diagram of control signals and associated MLT3 waves for the frequency converter of either FIG. 5A or FIG. 5B (A), and a composite waveform after a weighted sum (B).

An exemplary timing diagram for these three TSC circuits and their corresponding MLT3$^{(3/8)}$ waves is shown in FIG. 8(A). All three "sign" controls (SN_1, SN_2, and SN_3) are square waves of period T with 50% duty cycle; however, their timings are spaced in a T/8 step, i.e. SN_2 has a delay of T/8 relative to SN_1, and SN_3 has a delay of T/8 relative to SN_2. All three "zero" controls (ZR_1, ZR_2, and ZR_3) are rectangular waves of period T/2 with 25% duty cycle (i.e. stay high for a duration of T/8 and then stay low for a duration of 3T/8 in each cycle); however, their timings are spaced in a T/8 step, i.e. ZR_2 has a delay of T/8 relative to ZR_1, and ZR_3 has a delay of T/8 relative to ZR_2. The respective MLT3$^{(3/8)}$ waveforms for these three TSC circuits are also depicted in FIG. 8(A). By scaling each MLT3$^{(3/8)}$ signal with a respective gain and summing the scaled MLT3$^{(3/8)}$ signals together, one can synthesize a waveform to approximate a sinusoidal wave, as shown in FIG. 8(B). Since the synthesized waveform is close to an ideal sinusoidal signal, the harmonics are greatly suppressed, compared to a square wave or a single MLT3$^{(3/8)}$ wave. Note that the scaling is realized using a gain element associated with each TSC circuit; and the summing is realized using a summing circuit.

Figure 9:
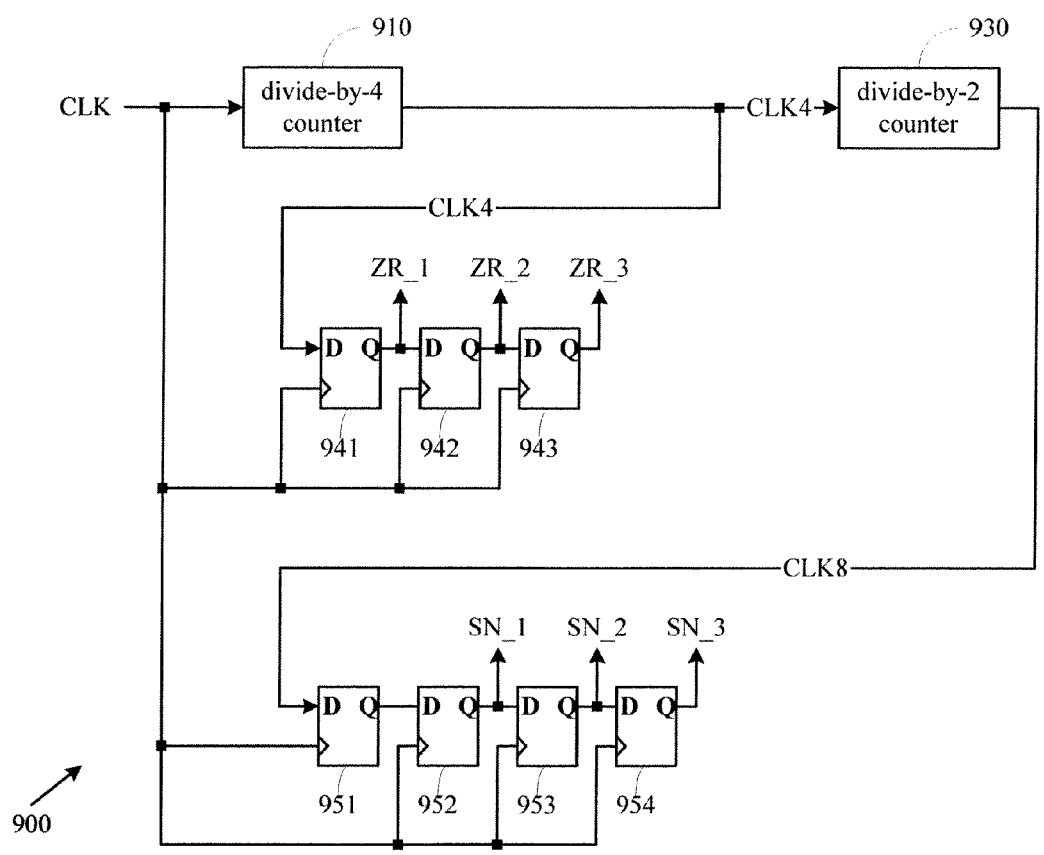
FIG. 9 shows an embodiment for generating the control signals shown in FIG. 8.

FIG. 9 shows an exemplary embodiment for generating the control signals needed for implementing the three MLT3$^{(3/8)}$ waves shown in FIG. 8(A). A first clock CLK of period T/8 must be provided, say from a phase-lock-loop (PLL) circuit. A second clock CLK4 of period T/2 is derived from the first clock CLK using a divide-by-4 counter 910. A third clock CLK8 of period T is derived from the second clock CLK4 using a divide-by-2 counter 930. Note that the duty cycle of CLK4 is ¼, because CLK4 is generated from a divide-by-4 counter; the reason is well understood in prior art and thus not explained here. Also, the duty cycle of CLK8 is ½, because CLK8 is generated from a divide-by-2 counter 930; the reason is well understood in prior art and thus not explained here. A first register array comprising DFF (data flip flop) 941, 942, and 943 is used to sample the second clock CLK4 at a rising edge of the first clock CLK, resulting in three "zero" signals, ZR_1, ZR_2, and ZR_3. As a result, the three "zero" signals have the same period of T/2 and the same duty cycle of ¼ but have timings spaced in a step of T/8. A second register array comprising DFF (data flip flop) 951, 952, 953, and 954 is used to sample the third clock CLK8 at a rising edge of the first clock CLK, resulting in three "sign" signals, SN_1, SN_2, and SN_3. As a result, the three "sign" signals have the same period of T and the same duty cycle of ½ but have timings spaced in a step of T/8. Note that there is one more DFF (951) inserted in the second register array, therefore, the three "sign" signals have an extra delay of T/8 compared to the three "zero" signals. The detailed circuit embodiments of a data flip-flop, a divide-by-4 counter, and a divide-by-2 counter are well known to those of ordinary skill in the art and thus are not described here.

To summarize what has been disclosed thus far, a harmonic suppression frequency conversion can be fulfilled using a plurality of parallel TSC (tri-state chopper) circuits, each of which are controlled by two logical signals, to realize a plurality of parallel MLT3 multiplications and then performing a weighted sum of all multiplication products. In particular, a MLT3 waveform of $T_1=T_{-1}=T/3$ and $T_0=T/6$ has a highly desirable property of having zero $3^{rd}$ order harmonics, and a perfect harmonics rejection up to the $9^{th}$ order can be fulfilled using a weighted sum of three parallel MLT3 multiplications of this particular MLT3 waveform. In another special case, a MLT3 waveform of $T_1=T_{-1}=3T/8$ and $T_0=T/8$ has lower harmonics contents than a square wave, and a perfect harmonics rejection up to the $5^{th}$ order can be fulfilled using a weighted sum of three parallel MLT3 multiplications of this particular MLT3 waveform.

In general, one may freely tailor a design by properly choosing a MLT3 waveform, a number of parallel TSC circuits with respective weights, to achieve a desired composite waveform having a desired harmonics rejection.

Tri-State Chopper Based Direct Conversion Receiver

Figure 10:
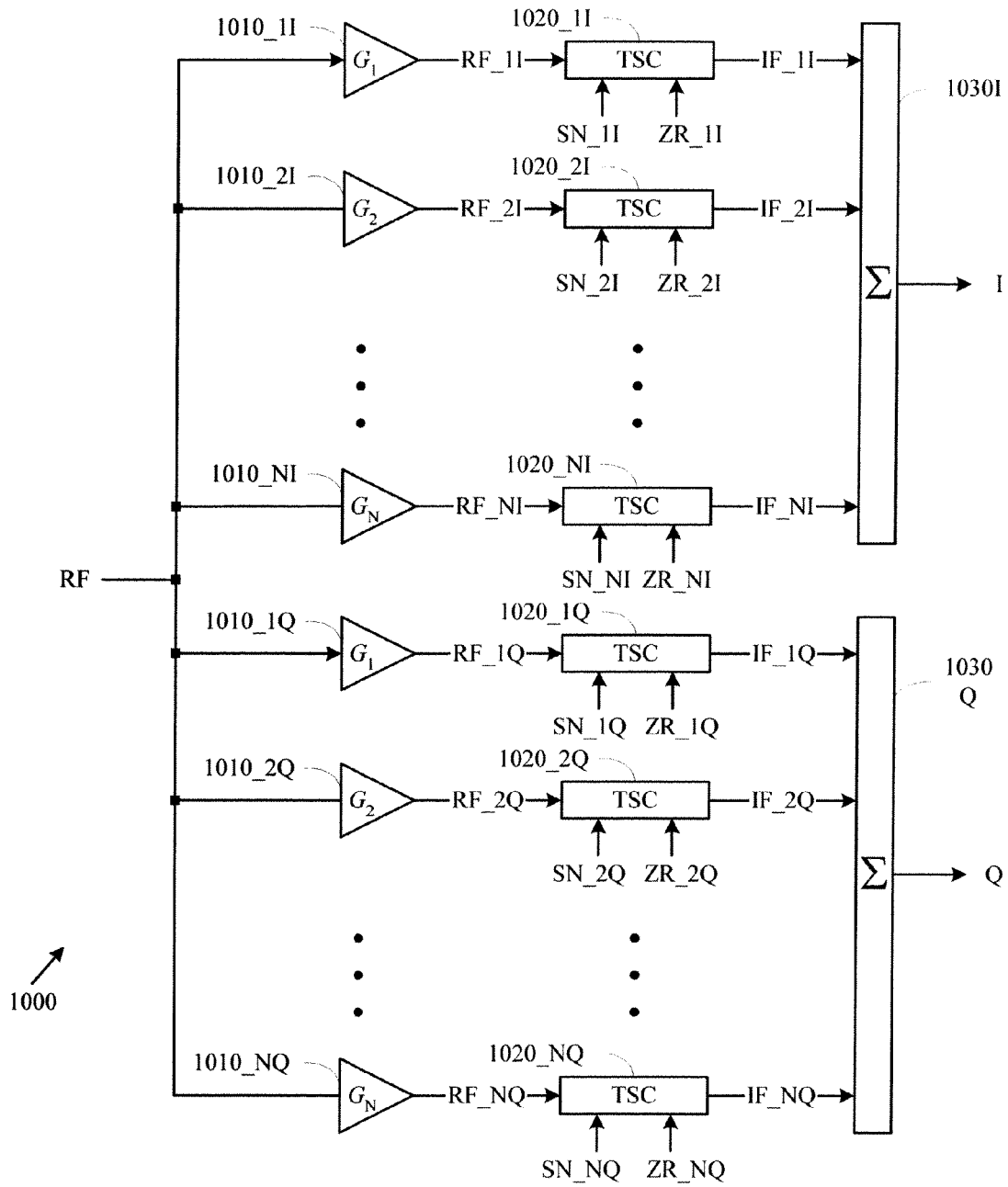
FIG. 10 shows an embodiment of a quadrature frequency converter using a plurality of TSC circuits.

In a direct conversion receiver, a quadrature frequency converter comprising an in-phase (I) conversion path and a quadrature (Q) conversion path is needed. The principle of TSC based frequency conversion disclosed above can be easily extended to quadrature frequency conversion. A quadrature frequency converter using a plurality of TSC circuits is illustrated in FIG. 10. Here, an input signal RF is converted into an in-phase signal I using an in-phase conversion path and into a quadrature output signal Q using a quadrature conversion path. The in-phase conversion path comprises a first group of gain elements (1010_1I, 1010_2I, and so on), a first group of TSC circuits (1020_1I, 1020_2I, and so on) using a first group of control signals (SN_1I, ZR_1I, SN_2I, ZR_2I, and so on), and a first summing element 1030I. The quadrature conversion path comprises a second group of gain elements (1010_1Q, 1010_2Q, and so on), a second group of TSC circuits (1020_1Q, 1020_2Q, and so on) using a second group of control signals (SN_1Q, ZR_1Q, SN_2Q, ZR_2Q, and so on), and a second summing element 1030Q. All "sign" signals (SN_1I, SN_1Q, SN_2I, SN_2Q, and so on) must be periodic with the same period (say T). All "zero" signals (ZR_1I, ZR_1Q, ZR_2I, ZR_2Q, and so on) must also be periodic with the same period (say T/2). The quadrature conversion path has substantially the same circuit as the in-phase conversion path. The control signals for the quadrature conversion path (i.e. SN_1Q, ZR_1Q, SN_2Q, ZR_2Q, and so on) also have substantially the same waveforms as their respective counterparts in the in-phase conversion path (i.e. SN_1I, ZR_1I, SN_2I, ZR_2I, and so on); however, they must have a constant timing offset of approximately T/4 relative to their respective counterparts in the in-phase conversion path. For instance, SN_1Q has the same waveform as SN_1I but has a constant timing offset of T/4 relative to SN_1I, and ZR_1Q has the same waveform as ZR_1I but has a constant timing offset of T/4 relative to ZR_1I. In this manner, each TSC circuit effectively performs a MLT3 multiplication, where the MLT3 wave for any TSC circuit in the quadrature conversion path has a timing offset of T/4 relative to its counterpart in the in-phase conversion path.

A special case of interest is to use three TSC circuits for the in-phase conversion path and another three TSC circuits for the quadrature phase, and effectively synthesize an in-phase composite wave $M_I$ and a quadrature composite wave $M_Q$ in accordance with the following mathematical expression:

$$M_I(t)=G_1\cdot MLT3(t+\tau)+G_2\cdot MLT3(t)+G_3\cdot MLT3(t-\tau)$$

$$M_Q(t)=G_1\cdot MLT3(t+\tau-T/4)+G_2\cdot MLT3(t-T/4)+G_3\cdot MLT3(t-\tau-T/4)$$

Here, the MLT3 wave is determined by the "sign" signal and the "zero" signal for each TSC circuit, T is the period of the MLT3 wave and τ is a timing offset. In a first example, one chooses $T_1=T_{-1}=T/3$ and $T_0=T/6$ for the MLT3 wave, $\tau=T/12$, $G1=G3$, and $G_2=2\cos(\pi/6)\cdot G_1$; this allows a quadrature down-conversion capable of rejecting up to the $9^{th}$ order harmonics mixings. In a second example, one chooses $T_1=T_{-1}=3T/8$ and $T_0=T/8$ for the MLT3 wave, $\tau=T/8$, $G1=G3$, and $G_2=2\cos(\pi/4)\cdot G_1$; this allows a quadrature down-conversion capable of rejecting up to the $5^{th}$ order harmonics mixings.

Figure 11:
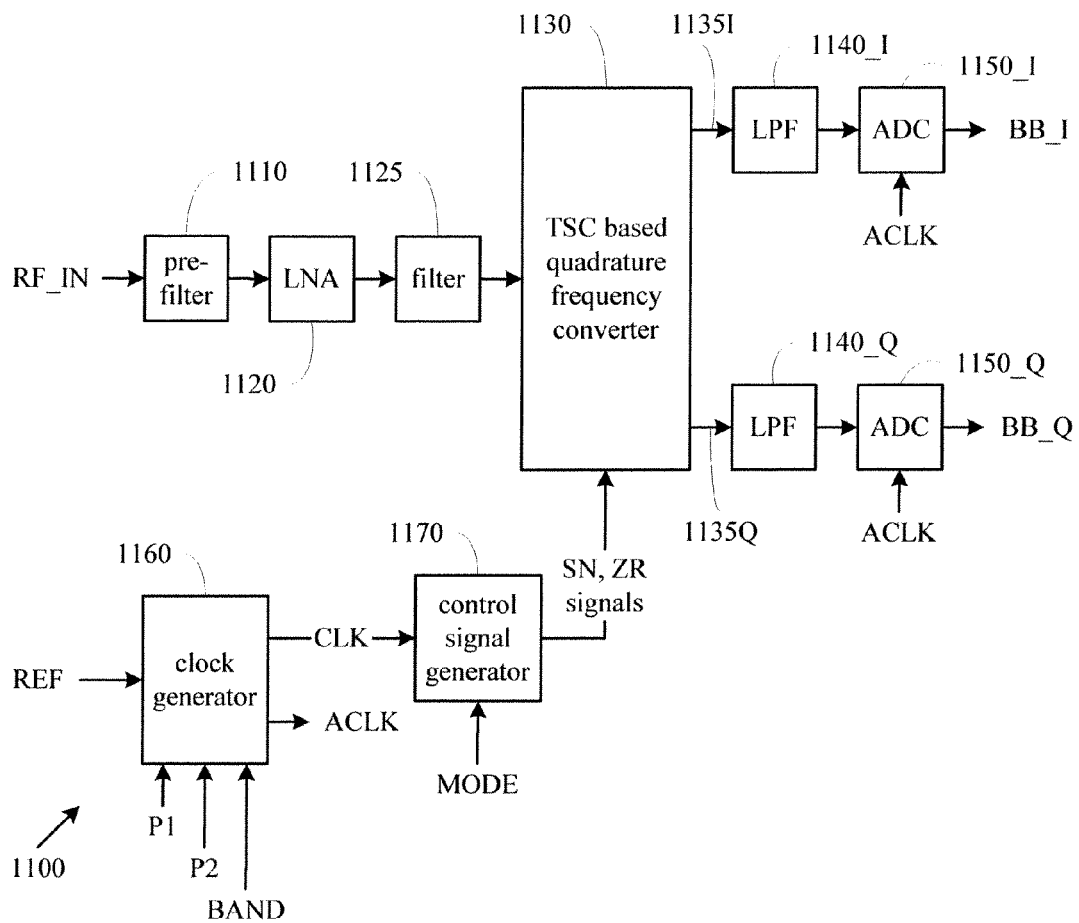
FIG. 11 shows a direct conversion receiver using a TSC based quadrature frequency converter.

A direct conversion receiver, which is particularly useful for but not limited to implementing a TV tuner, is illustrated in FIG. 11. Here, receiver 1100 comprises an optional pre-filter 1110, a LNA (low noise amplifier) 1120, an optional filter 1125, a TSC based quadrature frequency converter 1130, an in-phase path comprising a first LPF (low pass filter) 1140_I and a first ADC (analog-digital converter) 1150_I, a quadrature path comprising a second LPF 1140_Q and a second ADC 1150_Q, a clock generator 1160, and a control signal generator 1170. An input signal RF_IN, received from for example an antenna, is filtered by the optional pre-filter 1110, then amplified by LNA 1120, then filtered by the optional filter 1125, and then converted into an in-phase signal 1135I and quadrature signal 1135Q using TSC based quadrature frequency converter 1130. The in-phase signal 1135I is filtered by LPF 1140_I and digitized into a first output signal BB_I using ADC 1150_I, while the quadrature signal 1135Q is filtered by LPF 1140_Q and digitized into a second output signal BB_Q using ADC 1150_Q. Clock generator 1160 receives a reference clock REF, a first set of parameters P1, a second set of parameters P2, and a control signal BAND, and generate accordingly a first clock signal CLK and a second clock signal ACLK. The frequency of CLK has a certain relationship with the frequency of the desired RF signal to be converted; for example, the frequency of CLK is either 8 times or 12 times as high as the frequency of the desired RF signal to be converted, depending on whether $MLT3^{(3/8)}$ or $MLT3^{(1/3)}$ is chosen. The control signal generator 117 receives the first clock signal CLK and a control signal MODE and generates accordingly a plurality of "sign" control signals (SN) and a plurality of "zero" control signals (ZR). These SN and ZR signals are provided to the TSC based quadrature frequency converter 1130. The second clock signal ACLK is provided to ADC 1150_I and 1150_Q as their master clock for analog-digital conversion. In an embodiment, the TSC based quadrature frequency converter 1130 is built using the quadrature frequency converter 1000 of FIG. 10.

Figure 12:
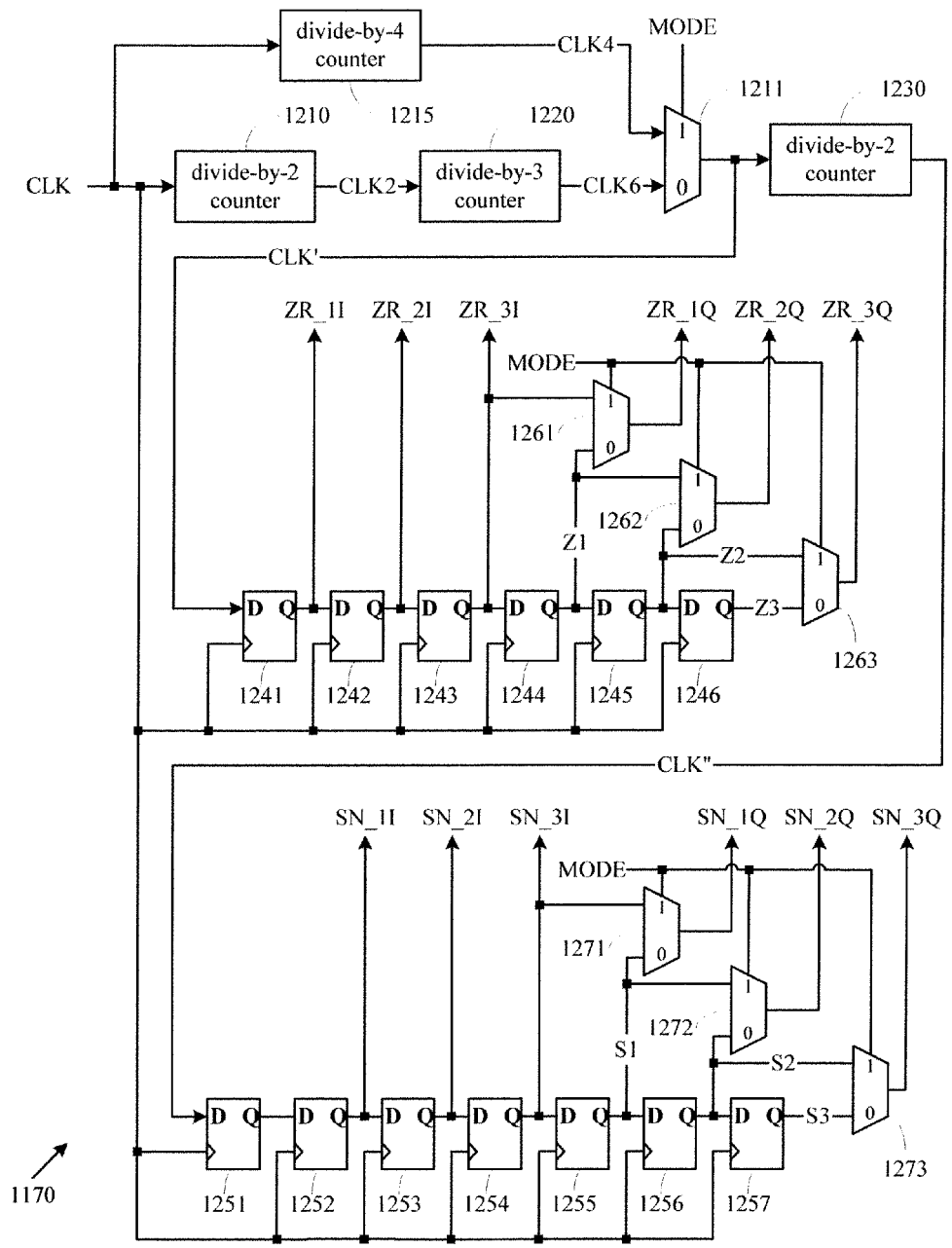
FIG. 12 shows an embodiment of a controls signal generator for the receiver of FIG. 11.

FIG. 12 shows an exemplary embodiment for the control signal generator 1170 of FIG. 11. The embodiment 1170 receives a first clock signal CLK and a control signal MODE and generates a group of in-phase control signals (i.e. SN_1I, ZR_1I, SN_2I, ZR_2I, SN_2I, and ZR_2I) and a group of quadrature control signals (i.e. SN_1Q, ZR_1Q, SN_2Q, ZR_2Q, SN_2Q and ZR_2Q). The control signal MODE determines the MLT3 waveform to be used: when MODE=1, $MLT3^{(3/8)}$ is used, otherwise $MLT3^{(1/3)}$ is used. Let the period of the desired RF signal to be converted be T. When MODE=1, the period of the clock signal CLK is T/8, otherwise the period of the clock signal CLK is T/12. The clock signal CLK is divided down by a first divide-by-2 counter 1210, resulting in a second clock CLK2. The second clock CLK2 is further divided down by a divide-by-3 counter 1220, resulting in a third clock CLK6. The clock signal CLK is also divided down by a divide-by-4 counter 1215, resulting in a fourth clock CLK4. A first multiplexer 1211 chooses between CLK4 and CLK6 for generating a fifth clock CLK'; when MODE=1, CLK4 is chosen, otherwise CLK6 is chosen. In either case, CLK' has a period of T/2. CLK' is further divided down by a second divide-by-2 counter 1230, resulting in a sixth clock CLK" having a period of T. A first register array comprising DFF (data flip flop) 1241-1246 is used to sample CLK' at a rising edge of the first clock CLK, resulting in three in-phase "zero" signals, ZR_1, ZR_2, and ZR_3, and three intermediate signals Z1, Z2, and Z3. As a result, the three "zero" signals and the three intermediate signals have the same period of T/2 and the same duty cycle of either ¼ or ⅓ but have timings spaced in a step of either T/8 or T/12, depending on the value of MODE. A second register array comprising DFF (data flip flop) 1251-1257 is used to sample the sixth clock CLK" at a rising edge of the first clock CLK, resulting in three in-phase "sign" signals, SN_1, SN_2, and SN_3, and three intermediate signals S1, S2, and S3. As a result, the three "sign" signals and the three intermediate signals have the same period of T and the same duty cycle of ½ but have timings spaced in a step of either T/8 or T/12, depending on value of MODE. Three multiplexers 1261-1263 are used to choose between {ZR_3I, Z1, Z2} and {Z1, Z2, Z3} for generating the quadrature "zero" signals: when MODE=1, ZR_3I, Z1, and Z2, are chosen for ZR_1Q, ZR_2Q, and ZR_3Q, respectively; otherwise, Z1, Z2, and Z3, are chosen for ZR_1Q, ZR_2Q, and ZR_3Q, respectively. As a result, ZR_1Q, ZR_2Q, and ZR_3Q have a timing offset of T/4 relative to ZR_1I, ZR_2I, and ZR_3I, respectively, regardless of the value of MODE. Another three multiplexers 1271-1273 are used to choose between {SN_3I, S1, S2} and {S1, S2, S3} for generating the quadrature "sign" signals: when MODE=1, SN_3I, S1, and S2, are chosen for SN_1Q, SN_2Q, and SN_3Q, respectively; otherwise, S1, S2, and S3, are chosen for SN_1Q, SN_2Q, and SN_3Q, respectively. As a result, SN_1Q, SN_2Q, and SN_3Q have a timing offset of T/4 relative to SN_1I, SN_2I, and SN_3I, respectively, regardless of the value of MODE. Note that there is one more DFF (1251) inserted in the second register array, therefore, the "sign" signals have an extra delay of either T/8 or T/12 compared to the zero signals, depending on the value of MODE.

Figure 13:
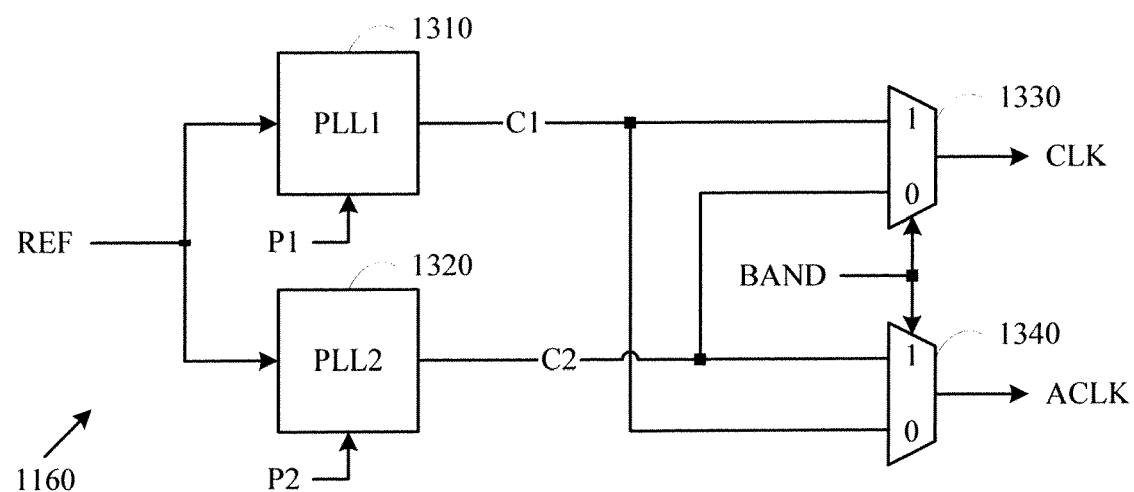
FIG. 13 shows an embodiment of a clock generator for the receiver of FIG. 11.

FIG. 13 shows an exemplary embodiment for the clock generator 1160 of FIG. 11. Here, the embodiment 1160 comprises: a first phase lock loop circuit PLL1 1310 for receiving the reference clock REF and the first set of parameters P1 and for generating a first intermediate clock signal C1, a second phase lock loop circuit PLL2 1320 for receiving the reference clock REF and the second set of parameters P2 and for generating a second intermediate clock C2, and two multiplexers 1330 and 1340 for receiving the first intermediate clock C1, the second intermediate clock C2, and the control signal BAND and for generating the first clock CLK and the second clock ACLK. When BAND=1, C1 is selected for CLK and C2 is selected for ACLK; otherwise, C2 is selected for CLK and C1 is selected for ACLK. The embodiment of a phase lock loop circuit is well known in prior art and thus not described here. Parameters P1 and P2 are circuit parameters needed for controlling PLL1 and PLL2, respectively; they are design dependent and may include the following parameters: reference division ratio, feedback division ratio, output division ratio, and a set of values of circuit elements (resistors, capacitors, current sources, and so on). Each of PLL1 and PLL2 has a controllable oscillator covering a certain frequency range.

In general, it is preferred to let the controllable oscillator within PLL1 cover a frequency range that is not overlapped with the frequency range covered by the controllable oscillator within PLL2. In doing so, one enables the clock generator 1160 to cover a broader frequency range than the case where there is an overlapping.

Now refer back to FIG. 11. Parameters P1 and P2 and control signals BAND and MODE are set according to the desired RF frequency to be down converted. Again, let the RF frequency to be down converted be 1/T. In general, it is preferable to set the control signal MODE to 0 (i.e. MLT3$^{(1/3)}$ waves are used for quadrature frequency converter 1130) unless both PLL1 and PLL2 within clock generator 1160 are unable to generate a frequency of 12/T. That is, one will prefer to choose MLT3$^{(1/3)}$ (over MLT3$^{(3/8)}$) to achieve a better harmonics rejection whenever it is possible to generate the needed clock (of frequency 12/T) from either PLL1 or PLL2. Once MODE is set, the control signal BAND is set depending on which PLL is able to generate the needed clock CLK (of frequency 12/T or 8/T). If both PLL1 and PLL2 are able to generate the needed clock CLK, one that is capable of generating a better clock (i.e. with less jitter) is chosen. In contrast to CLK, whose frequency needed to be tuned in response to the RF frequency to be down converted, the frequency of ACLK does not need to be tuned and thus can be set to a fixed value. Of course, one may still choose to tune the frequency of ACLK; however, there is no advantage in doing so. Once BAND and MODE are set, P1 and P2 are set accordingly so that one of C1 and C2 (within clock generator 1160 of FIG. 13) has a frequency of 12/T (when MODE=0) or 8/T (when MODE=1) and the other has a frequency of a certain value.

Alternative Embodiments

The principle disclosed by the current invention can be practiced in various forms. For example:
1. A gain element accompanying an associated TSC circuit (within a frequency conversion path) for effectively scaling an effective MLT3 multiplication implied by the TSC circuit can be placed either before the TSC circuit or after the TSC circuit. For instance, gain stage 1010_1I is placed before TSC 1020_1I in FIG. 10, but can also be alternatively placed after TSC 1020_1I. Although not absolutely necessary, it is highly desirable that the rest of the gain elements in FIG. 10 are also placed after their respective TSC circuits if gain element 1010_1I is placed after TSC 1020_1I (i.e., gain element 1010_2I is placed after TSC 1020_2I, gain element 1010_1Q is placed after TSC 1020_1Q, and so on) so that all parallel paths match well.
2. A gain element accompanying an associated TSC circuit (within a frequency conversion path) for effectively scaling an effective MLT3 multiplication implied by the TSC circuit can be implemented using either a current-mode device (e.g. trans-conductance amplifier) or a voltage-mode device (e.g. operational amplifier).
3. A summing circuit for summing up all outputs from a plurality of TSC-based conversion paths can be implemented using either: (1) a direct tying of all outputs when all gain elements within said TSC-based conversion paths are implemented using current-mode devices, or (2) an operational amplifier when all gain elements within said TSC-based conversion paths are implemented using voltage-mode devices.
4. Instead of using a plurality of analog gain elements for implementing a plurality of "scaling" functions and an analog summing circuit for summing outputs from a plurality of conversion paths, one may choose to implement both the "scaling" and the "summing" function in a digital domain. In the digital domain embodiment: no analog gain elements are needed; an input RF signal is converted into a plurality of conversion signals by a plurality of TSC circuits, respectively; said conversion signals are filtered by a plurality of low pass filters, respectively; outputs from said low pass filters are digitized into a plurality of digital words by a plurality of analog-digital converters; said digital words are scaled by a plurality of digital gain elements, respectively, and summed together to generate a final output. Now refer to FIG. 11. When the "scaling" and the "summing" functions within the TSC-based quadrature frequency converter 1130 are implemented in the digital domain, signals 1135I and 1135Q are readily the final digitized baseband outputs, and therefore LPF 1140_I and 1140_Q and ADC 1150_I and 1150_Q must be removed.

5. $MLT3^{(3/8)}$ and $MLT3^{(1/3)}$ are just two convenient examples of a MLT wave realized by a "sign" signal and a "zero" signal. There are numerous alternative MLT3 waves that one can realize by properly choosing the periods, duty cycles, and timing offsets for the "sign" signal and the "zero" signal. In an extreme case, one may choose $MLT3^{(1/2)}$, which is a special case where a MLT3 wave degenerates into a square wave, by set the "zero" signal to be logically low.

6. Using three TSC circuits along with three "sign" signals and three "zero" signals to implement a frequency down conversion is just a convenient example. One is freely to choose any number of TSC circuits along with properly timed "sign" signals and "zero" signals and proper weights to implement a frequency down conversion to achieve a desired performance of harmonics rejection.

7. Instead of choosing between two MLT3 waves (e.g. $MLT3^{(3/8)}$ and $MLT3^{(1/3)}$), one may choose from more than MLT3 waves. For example, one may choose among $MLT3^{(1/2)}$, $MLT3^{(3/8)}$ and $MLT3^{(1/3)}$ for a given RF frequency to be down converted. In this case, the control signal MODE needs to have three possible values.

8. Instead of choosing between two MLT3 waves (e.g. $MLT3^{(3/8)}$ and $MLT3^{(1/3)}$), one may choose to use exclusively one MLT3 wave (e.g. $MLT3^{(3/8)}$ or $MLT3^{(1/3)}$). In this case, one does not need the MODE signal, and the control signal generator 1170 of FIG. 12 can be greatly simplified. For example, all multiplexers within the control signal generator 1170 of FIG. 12 can be removed, and also some of the divide-down counters can be removed, depending which MLT3 wave is to be used.

9. Instead of using two PLL circuits to generate CLK and ACLK, one may choose to use more than two PLL circuits but choose only two of them to generate CLK and ACLK. This arrangement requires more circuits but has an advantage that requirement of frequency range for each PLL can be reduced. In this case, the control signal BAND needs to have more than two possible values.

Those skilled in the art will readily observe that numerous modifications and alterations of the device and method may be made while retaining the teachings of the invention. Accordingly, the above disclosure should be construed as limited only by the metes and bounds of the appended claims.

The invention claimed is:

1. A receiver comprising:
   a gain device for receiving an input signal and for generating an amplified signal;
   a quadrature frequency converter for receiving the amplified signal, a first set of ternary signals, and a second set of ternary signals and for generating a first intermediate signal and a second intermediate signal;
   a first filter for receiving the first intermediate signal and for generating a third intermediate signal;
   a second filter for receiving the second intermediate signal and for generating a fourth intermediate signal;
   a first analog-to-digital converter for receiving the third signal and a first clock signal and for generating a first output signal;
   a second analog-to-digital converter for receiving the fourth signal and the first clock and for generating a second output signal;
   a clock generator for receiving a reference clock and for generating the first clock; and
   a control signal generator for generating the first set of ternary signals and the second set of ternary signals.

2. The receiver of claim 1 is a TV tuner.

3. The receiver of claim 1, wherein all ternary signals in the first set and all ternary signals in the second set have the same periodicity, and have substantially the same waveform.

4. The receiver of claim 3, wherein all ternary signals in the first set have different timing offsets.

5. The receiver of claim 4, wherein all ternary signals in the second set have different timing offsets.

6. The receiver of claim 1, wherein each ternary signal in the first set is encoded by two binary signals.

7. The receiver of claim 6, wherein both of the two binary signals are periodic and one of the two binary signals is two-times higher in frequency than the other binary signal.

8. The receiver of claim 1, wherein the clock generator comprises a plurality of phase lock loops for generating a plurality of intermediate clocks, respectively.

9. The receiver of claim 8, wherein the clock generator further comprises a clock selecting circuit for generating the first clock and a second clock by selecting two among said intermediate clocks, wherein the control signal generator generates the first set of ternary signals and the second set of ternary signals in response to the second clock.

10. The receiver of claim 1, wherein the control signal generator comprises a counter for receiving the second clock and for generating a divided-down clock.

11. The receiver of claim 10, wherein the control signal generator further comprises a plurality of sampling circuits working in accordance with at an edge of the second clock to generate a plurality of sampled clocks from the divided-down clock.

12. The receiver of claim 11, wherein at least some of said sampled clocks form at least a part of said ternary signals, either in the first set or in the second set.

13. A method of processing an input signal, the method comprising:
   amplifying the input signal to generate an amplified signal;
   down-converting the amplified signal into two intermediate signals using a first set of ternary signals and a second set of ternary signals, respectively;
   filtering the first intermediate signal to generate a third intermediate signal;
   filtering the second intermediate signal to generate a fourth intermediate signal;
   digitizing the third intermediate signal into a first output signal in accordance with a first clock;
   digitizing the fourth intermediate signal into a second output signal in accordance with the first clock; and
   generating the first set of ternary signals and the second set of ternary signals based on a second clock.

14. The method of claim 13, wherein the amplifying comprises a filtering function.

15. The method of claim 13, wherein all ternary signals in the first set and all ternary signals in the second set are periodic, have the same periodicity, and have substantially the same waveform.

16. The method of claim 15, wherein all ternary signals in the first set have different timing offsets.

17. The method of claim 16, wherein all ternary signals in the second set have different timing offsets.

18. The method of claim 13, wherein each ternary signal in the first set is encoded by two binary signals, and so does each ternary signal in the second set.

19. The method of claim 18, wherein both of the two binary signals are periodic and one of the two binary signals is two-times higher in frequency than the other binary signal.

20. The method of claim 13, further comprising:
synthesizing the first clock and the second clock in response a reference clock.

21. The method of claim 20, wherein the synthesizing step further comprises:
generating a plurality of intermediate clocks in response a reference clock; and
selecting among said intermediate clocks to generate the first clock and the second clock.

22. The method of claim 13, wherein the generating the ternary signals step further comprises using a divide-down counter to divide down the second clock to generate a divided-down clock.

23. The method of claim 22, wherein the generating the ternary signals step further comprises using a plurality of sampling circuits working in accordance with an edge of the second clock to generate a plurality of sampled clocks from the divided-down clock.

24. The method of claim 23, wherein the generating the ternary signals step further comprises selecting among said sampled clocks to form at least a part of said ternary signals, either in the first set or in the second set.

* * * * *